United States Patent

[11] 3,604,990

[72] Inventor Raymond A. Sigsbee
Schenectady, N.Y.
[21] Appl. No 24,653
[22] Filed Apr. 1, 1970
[45] Patented Sept. 14, 1971
[73] Assignee General Electric Company

[54] SMOOTHLY CHANGING VOLTAGE-VARIABLE CAPACITOR HAVING AN EXTENDIBLE PN JUNCTION REGION
14 Claims, 7 Drawing Figs.

[52] U.S. Cl. .................... 317/234 R, 317/235 R, 317/234 U, 317/235 B, 317/235 AG, 307/299, 307/320, 317/249
[51] Int. Cl. .................... H01l 5/02
[50] Field of Search .................... 317/234/9, 235/21.1, 46, 237–241

[56] References Cited
UNITED STATES PATENTS

| | | | |
|---|---|---|---|
| 2,964,648 | 12/1960 | Doucette et al. | 317/234 X |
| 2,989,650 | 6/1961 | Doucette et al. | 317/234 X |
| 3,045,129 | 7/1962 | Atalla et al. | 317/235 X |
| 3,206,670 | 9/1965 | Atalla | 317/235 X |
| 3,303,059 | 2/1967 | Kerr et al. | 317/235 X |
| 3,339,128 | 8/1967 | Olmstead et al. | 317/235 |
| 3,401,349 | 9/1968 | Mitchell | 317/235 X |
| 3,439,236 | 4/1969 | Blicker | 317/235 |
| 3,454,894 | 7/1969 | Voorhoeve | 317/235 X |

*Primary Examiner*—John W. Huckert
*Assistant Examiner*—B. Estrin
*Attorneys*—Richard R. Brainard, Paul A. Frank, John J. Kissane, Frank L. Neuhauser, Oscar B. Waddell and Joseph B. Forman

ABSTRACT: A voltage-variable semiconductive capacitor is described wherein a smooth alteration in output capacitance is produced by incrementally extending a PN junction along the surface of a semiconductive body with an inversion layer formed below a control electrode insulator characterized by a decreased capacitance with increased span of the insulator from the expanding edge of the PN junction. In a first embodiment of the invention, the decreased capacitance is achieved by increasing the thickness of the control electrode insulator at a linear slope between 0.25 and 3.0 percent while in a second embodiment, the thickness of the control electrode insulator is increased in uniform steps of approximately 200–500 A, to produce a digitalized change in output capacitance. A capacitor structure also is described wherein isolated regions of a first type conductivity within a semiconductive body of second type conductivity are sequentially interconnected utilizing commonly energized control electrodes having a gradually reduced capacitance relative to the underlying semiconductive body with increased departure of each electrode from the edge of the initially extended region.

INVENTOR:
RAYMOND A. SIGSBEE,
by John J. Kissane
HIS ATTORNEY

INVENTOR:
RAYMOND A. SIGSBEE,
by John J. Kessane
HIS ATTORNEY

SMOOTHLY CHANGING VOLTAGE-VARIABLE CAPACITOR HAVING AN EXTENDIBLE PN JUNCTION REGION

This invention relates to a voltage-variable capacitor structure and, in particular, to a semiconductive structure wherein variations in output capacitance produced by extension of a PN junction are incrementally regulated utilizing a control electrode insulator exhibiting a reduced capacitance with increased departure of the insulator from the edge of the PN junction being extended.

Voltage-variable capacitor semiconductive devices, i.e., semiconductor devices having an output capacitance which varies as a function of the voltage applied to the input terminals, often are desirable in the fabrication of tunable resonant circuits in integrated circuitry and the number of diverse structures operating on different principles heretofore have been utilized for such purposes. For example, conventional PN junction diode variable capacitors employ a variation in the thickness of the depletion region of the diode to produce a fluctuation in output capacitance while the capacitance of conventional MOS devices can be varied by altering the thickness of the depletion region underlying the gate electrode in response to alterations in gate voltage. In my copending U.S. application Ser. No. 766,605, filed Oct. 10, 1968, now Pat. No. 3,560,815, and assigned to the assignee of the present invention, there also is disclosed a voltage variable diode capacitor having an extendible PN junction to significantly enhance the area in which the applied electric field has an appreciable effect on charge carriers. While the diode capacitor disclosed in the heretofore cited patent application is characterized by a large ratio of maximum capacitance to minimum capacitance, switching between capacitance levels is rapid making fine control of the overall capacitance of the structure relatively difficult to achieve.

It is therefore an object of this invention to provide a semiconductive capacitor exhibiting a gradually varying transition between widely separated capacitance levels.

It is also an object of this invention to provide a semiconductive capacitor having a smoothly varying digitalized capacitive response.

It is a further object of this invention to provide a smoothly varying semiconductive capacitor requiring a minimum of external electrical connections.

It is a still further object of this invention to provide a smoothly varying semiconductive capacitor capable of being easily fabricated at minimum costs.

These and other objects of this invention generally are achieved by a voltage variable semiconductive capacitor having a PN junction which is extendible beneath a control electrode insulator characterized by a gradually diminishing capacitance with increased departure of the insulator from the PN junction edge. Thus a capacitor structure in accordance with this invention would include a semiconductive body of first type conductivity having at least one region of second type conductivity extending through a major face of the semiconductive body to a predetermined depth. An insulating layer and an electrically continuous conductive film sequentially overlie at least a portion of the first conductivity region of the major face of the semiconductive body and extend beyond an edge of the second type conductivity region. To provide a smoothly varying output capacitance in accordance with this invention, the insulating layer is characterized by a capacitance which diminishes in value with increased departure of the insulating layer from the edge of the second type conductivity region. When a control signal of increasing amplitude therefore is applied between the conductive film and the semiconductive body by suitable means, the gradually diminishing capacitance of the insulating layer produces a gradual extension of the second type conductivity region along the interface between the insulating layer and the semiconductive body to a span determined by the amplitude of the applied control signal and the capacitance of the insulating layer. The junction capacitance of the structure therefore varies in a smoothly increasing fashion with each gradual extension of the second type conductivity region below the insulating layer and the junction capacitance can be sensed by suitable means connected between the second type conductivity region and the semiconductive body.

In a first specific embodiment of this invention, the diminishing capacitance is obtained by an increase, i.e., either linear or stepped, in the thickness of the control electrode insulating layer with increased departure from the edge of the second type conductivity region while in a second embodiment of the invention, the PN junction between the first and second type conductivity regions is extended by sequentially interconnecting a second type conductivity region with adjacent regions of second type conductivity through inversion regions underlying electrically interconnected control electrodes having a gradually reduced capacitance relative to the underlying semiconductive body with increased departure of the control electrodes from the region being extended. Although linearly tapered insulators heretofore have been utilized in field effect transistors to homogenize the semiconductive layer of a thin film transistor, use of a tapered gate insulator to vary capacitance by incrementally extending a PN junction heretofore has not been suggested.

The novel features believed characteristic of the present invention are set forth in the appended claims. The invention itself, together with further objects and advantages thereof may best be understood with reference to the following detailed description taken in conjunction with the appended drawings in which:

Figure 1:
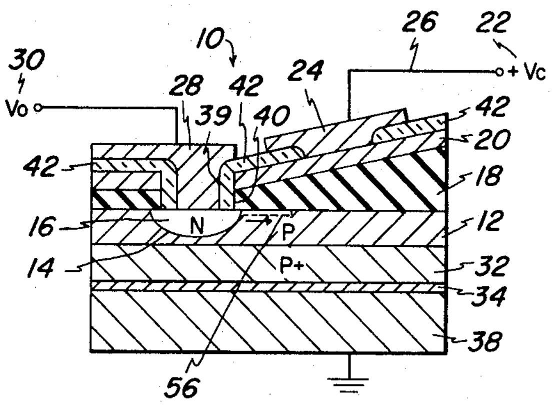
FIG. 1 is a sectional view of a smoothly varying capacitor in accordance with this invention.

A smoothly changing voltage-variable capacitor 10 in accordance with this invention is illustrated in FIG. 1 and generally comprises a semiconductive body 12 having an asymmetrically conducting junction 14 formed therein, for example, by diffusing a region 16 of N-type conductivity into a body of P-type conductivity silicon. A linearly tapered insulator 18 and an overlying control electrode 20 are disposed atop semiconductive body 12 at a location extending beyond into one edge of N-type conductivity region 16 with electrical contact between variable control voltage source 22 and the control electrode being achieved via aluminum contact 24 and external lead 26. Similarly, an aluminum contact 28 is deposited atop N-type conductivity region 16 to provide the capacitive output from the structure on terminal 30 while electrical contact to semiconductive body 12 is made in conventional fashion, e.g., by forming a highly conductive region 32 of similar type conductivity along the face of the body remote from the face through which region 16 is diffused. When cooling of the capacitor is desired, a metallic heat sink 38 of, for example, molybdenum, can be bonded to region 32 by disposing a gold adhesive layer 34 intermediate the silicon wafer and the molybdenum heat sink and heating the laminar structure to the gold-silicon eutectic temperature.

To form the smoothly varying capacitor of FIG. 1, a monocrystaline semiconductive wafer of, for example, silicon doped with approximately $10^{19}$ atoms/centimeter of boron and possessing a P-type conductivity characterized by a resistivity of approximately 0.01 ohm centimeters, is employed as highly conductive region 32 and semiconductive body 12 of lower conductivity, e.g., a body containing $1\times10^{15}$ atoms/centimeter and exhibiting a resistivity in the order of 10 ohm centimeters, is epitaxially grown thereon. Typically, the growth may be accomplished by juxtaposing a source of doped silicon in closely spaced relationship with highly conductive region 32 while maintaining a temperature gradient of approximately 100° C. between the doped silicon source and the highly conductive region, e.g., with the doped silicon source being maintained at a temperature of approximately 1,000° C. while highly conductive region 32 is maintained at 1,100° C. With an iodine vapor pressure of approximately 1 millimeter, doped silicon from the source is transported to the highly conductive region and semiconductive body 12 is epitaxially grown thereon. Suitably the silicon source employed for deposition contains a P-type impurity, e.g., boron, aluminum, gallium, indium etc., in a concentration to insure that the epitaxially grown body exhibits a resistivity at least approximately 100 fold the resistivity of high conductivity region 32. A more complete description of the heretofore described epitaxial growth technique can be obtained from U.S. Pat. No. 3,316,130, issued Apr. 25, 1967, to W. C. Dash and assigned to the instant assignee.

After epitaxial growth of semiconductive body 12, an oxide layer is thermally grown on the surface of the semiconductive body to a thickness in excess of 500 A., by heating the semiconductive body to approximately 1,000° C. in a flowing atmosphere of pure, dry oxygen. Typically, the oxide layer is grown to a uniform thickness between 1,000 A., and 5,000 A., whereupon the surface of the oxide layer is etched to a linear slope between one-fourth and 3 percent by contacting the oxide layer with a liquid containing a photodecomposable fluorine compound, e.g., fluorobenzene, fluorosulfonylbenzene, sulfonylchloride, etc. and exposing the oxide/liquid interface to activating radiation from a xenon lamp through a light filter having a similarly tapered light transmissivity. Fluorine is released at the oxide/liquid interface in quantities proportional to the quantity of activating irradiation impinging thereon and the released fluorine reacts with the juxtaposed oxide layer to dissolve the oxide layer to the desired linearly tapering configuration. This photolytic method of etching silicon dioxide along with other suitable photodecomposable compounds suitable for such purposes is described and claimed in U.S. Pat. No. 3,489,564 issued Jan. 13, 1970, in the name of Donald Schaefer and assigned to the assignee of the present invention. Other conventional techniques for forming a tapered insulator surface, e.g., by a penumbra deposition utilizing an elongated evaporation source and a mask spaced apart from a partially shielded substrate, also can be employed in the practise of this invention if desired.

While silicon dioxide is preferred as the control electrode insulator because of the ease of fabricating the insulator, any insulating materials commonly employed in semiconductor fabrication can be utilized to form tapered insulator 18. For example, a tapered aluminum oxide insulator can be formed by vacuum deposition of an aluminum film atop the surface of semiconductive body 12 whereafter the aluminum is anodized, e.g., by conventional plasma anodization, to completely oxidize the deposited aluminum. The aluminum oxide then can be etched by the heretofore described photolytic etching technique to form a linear taper between 0.25 and 3.0 percent in the aluminum oxide film. Similarly, amorphous films containing silicon, oxygen and nitrogen (generally referred to as silicon oxynitride) can be deposited atop the surface of semiconductive body 12 by pyrolytic decomposition from a mixture of a silane, oxygen and ammonia while the surface of the semiconductive body is maintained at a temperature of approximately 1,000° C. to 1,200° C. A tapered configuration in the film then can be obtained by the controlled decomposition of a fluorine containing compound at the insulator surface utilizing radiation having an intensity which tapers with linear distance along the length of the semiconductive body.

After formation of tapered gate insulator 18, a metallic film of molybdenum, tungsten, platinum, vanadium or other refractory conductor which is nonreactive with the underlying insulator at activator-diffusion temperatures, i.e., temperatures customarily between 900° C. and 1,400° C., is deposited atop tapered insulator 18. Typically, the refractory metal film is formed by conventional diode sputtering of the chosen source (hereinafter referred to as molybdenum for convenience) in an approximately $5\times10^{13}$ Torr argon atmosphere utilizing a 1,500 volt DC potential to deposit the molybdenum film to a thickness between 700 and 10,000 A., atop the gate insulator with sputtering for 15 minutes producing a 4,000 A., thick molybdenum film preferred for the practise of this invention. If desired, other refractory metal film forming techniques, such as vacuum evaporation or pyrolytic deposition, also may be employed to form control electrode 20.

The deposited molybdenum film then is etched utilizing conventional photoresist techniques to produce aperture 39 in the molybdenum film at the desired location for forming region 16 of N-type conductivity within the wafer. Desirably, the edge of aperture 39 proximate tapered insulator 18 overlies at least a 500 A., thick portion of the insulator to provide an insulator edge 40 at least 500 A., high upon subsequent etching of the underlying insulator using the apertured molybdenum film as a mask. Typically, etching of the molybdenum film may be accomplished using a ferricyanide etch comprising 92 grams potassium ferricyanide, 20 grams potassium hydroxide and 300 grams water while the silicon dioxide exposed by the molybdenum etch can be removed by a buffered HF solution containing one part concentrated HF and 10 parts of a 40 percent solution of $NH_4F$. The buffered HF solution (as well as other known etchants) also can be employed when aluminum oxide or silicon oxynitride is employed to form insulator 18.

After etching of the molybdenum film and underlying silicon dioxide layer to form aperture 39, a glass layer 42 containing a dopant of conductivity determining type opposite the dopants of semiconductive body 12 is deposited over the entire surface of the structure. Thus, for the P-type conductivity semiconductive body specifically illustrated in FIG. 1, a donor doped glass layer can be pyrolytically deposited by heating the structure to 800° C. and passing a flowing argon stream saturated with ethyl orthosilicate and triethylphosphate over the structure (as described in D. M. Brown et al., application Ser. No. 675,228 filed Oct. 13, 1967, and assigned to the assignee of the present invention). After deposition of glass layer 42 to a thickness of approximately 4,000 A., the entire structure is heated in vacuum to a temperature of about 1,150° C. for approximately 1½ hours to diffuse the phosphorus dopant from glass layer 42 through aperture 39 into semiconductive body 12 to a depth of approximately 3,000 A., thereby forming both N-type conductivity region 16 within the semiconductive body and PN junction 14 at the interface between region 16 and the semiconductive body. Typically region 16 is between approximately 3–20 microns wide and of annular geometric configuration. Because control electrode 20 and underlying insulator 18 serve as a mask during diffusion of N-type conductivity region 16, the slightly sideward diffusion of the region inherent during drivein assures registration between the gate electrode 20 and the edge of the N-type conductivity region.

Glass layer 42 then is etched with photoresist and a suitable etchant, e.g., the previously described buffered HF solution, to expose a portion of N-type conductivity region 16 and control electrode 20 whereupon a metal, suitably aluminum, is selectively deposited atop the surface of the capacitor to form electrical contacts 28 and 24 for the diffused N-type conductivity region and control electrode, respectively. Highly conductive region 32 of the capacitor next is bonded to molybdenum heat sink 38 and external contact to the capacitor is achieved by thermocompression or ultrasonic bonding of gold conductors to aluminum contacts 24 and 28 and molybdenum heat sink 38.

While smoothly varying capacitor 10 preferably has a refractory metal control electrode to produce inherent registration between the edge of the region being elongated and the control electrode forming the outwardly extending inversion region at the insulator-semiconductive body interface, the capacitor also can be fabricated utilizing conventional semiconductor registration techniques and control electrodes of metals such as aluminum, copper, gold, nickel, etc. For example, capacitor 10 can be formed by thermally growing a thick, e.g., 10,000 A., oxide (not shown) atop epitaxially grown semiconductive body 12 and subsequently aperturing the oxide to form a window for the diffusion of region 16 therein by heating the semiconductive body to a temperature above 1,000° C. in a vacuum chamber containing a donor vapor, such as zinc, whereupon the thick oxide layer mask is etched away from the semiconductive body surface. A thinner, e.g., 3,000 A., oxide layer then is grown atop the semiconductive surface and etched to a linear slope between one-fourth and 3 percent with at least a 500 A., thick edge overlying region 16 to form the control electrode insulator. Thereafter, aluminum can be deposited atop the tapered insulator to form control electrode 20 in registration with the N-type conductivity edge of region 16. Similarly while silicon is preferred for semiconductive body 12 because of the excellent electrical characteristics and reduced cost of fabricating silicon semiconductors, any semiconductive material such as germanium or a group III–V compound such as gallium arsenide, also can be employed for semiconductive body 12 if desired.

Figure 2:
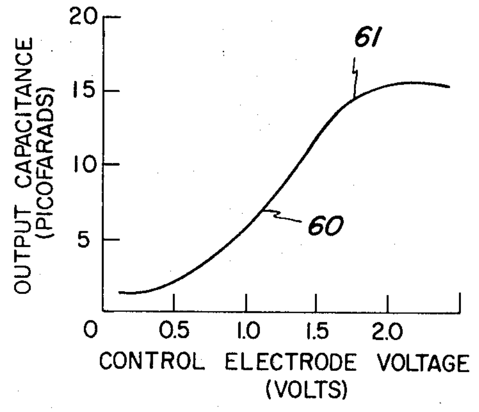
FIG. 2 is a graphical illustration depicting the variation in output capacitance with control voltage for the capacitor of FIG. 1.

In operation, control electrode 20 is connected to a variable control voltage 22 through external lead 26 and aluminum contact 24 while N-type conductivity semiconductive body 12 is maintained at ground potential by electrically grounded molybdenum heat sink 38. As control voltage 22 is increased in a positive direction with diode capacitor 10 in a reverse biased condition, e.g., a positive voltage of between 0.1 and 3 volts applied to N-type conductivity region 16, the majority charge carriers, i.e., holes, underlying control electrode 20 are repelled at the interface between insulator 18 and the juxtaposed P-type conductivity region of semiconductive body 12 adjacent the edge of N-type conductivity region 16 to establish a depletion region whereat the net concentration of charge carriers is decreased below the concentration of uncompensated acceptorions. As the positive potential upon the control electrode is further increased, minority charge carriers are drawn to the depletion region at the surface of semiconductive body adjacent N-type conductivity region 16 thereby forming an inversion layer 56 extending PN junction 14 outwardly along the surface of semiconductive body 12. Because the thickness of insulator 18 increases in a linear fashion with increased departure of the insulator from N-type conductivity region 16, the positive going control voltage applied to control electrode 20 initially produces a maximum depletion at the edge of N-type conductivity region 16 underlying the relatively closed spaced portion of the control electrode. The PN junction between the N-type conductivity region 16 and semiconductive body 12 thus is gradually extended outwardly from N-type conductivity region 16 by inversion layer 56 which layer extends to a length dependent upon the slope of insulator 18 and the potential applied between the control electrode and underlying semiconductive body 12. Because the capacitance of capacitor 10 (as sensed on output terminal 30) varies as a function of the extension of PN junction 16, each incremental alteration in control voltage source 22 produces an incremental variation in output capacitance. Such response is illustrated by capacitor characteristics curve 60 of FIG. 2 wherein the capacitance of the structure of FIG. 1 is seen to increase slowly with incremental changes in control voltage until the interface between semiconductive body 12 and insulator 18 is caused to completely invert (identified by point 61 of curve 60) whereupon a maximum capacitance output is obtained. This response is contrasted to the capacitor characteristic curves (not shown) of the variable capacitors described in my heretofore cited patent application wherein output capacitance varies rapidly between a maximum and minimum over a relatively small range of control voltage.

Figure 3:
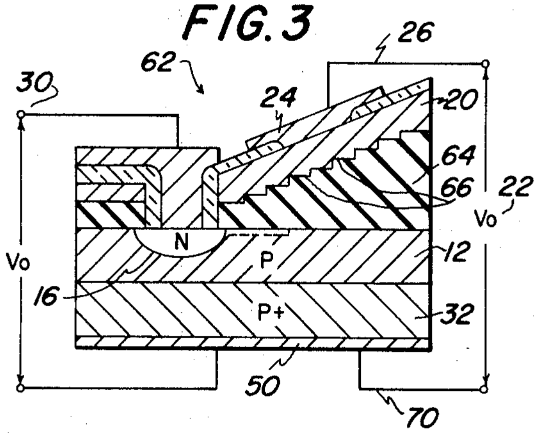
FIG. 3 is a sectional view of a digitalized output capacitor in accordance with this invention.
Figure 4:
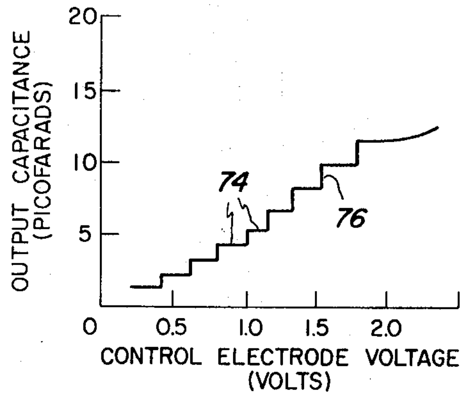
FIG. 4 is a graphical illustration depicting the variation in output capacitance with control voltage for the capacitor of FIG. 3.

While the voltage variable capacitor 10 is highly desirable when a linearly changing capacitance is desired, incremental digitalized changes in output capacitance with control voltage can be obtained utilizing voltage-variable diode capacitor 62 of FIG. 3. Structurally, capacitor 62 is identical to capacitor 10 with the exception that control electrode insulator 64 is photolytically etched through a transparency (not shown) having a light transmissivity varying in steplike fashion to provide a stepped contour 66 along the surface of the insulator remote from the semiconductive body 12. Capacitor 62 also is not mounted upon a metallic heat sink with ohmic contact to highly conductive region 32 being achieved in conventional fashion by vacuum evaporation of aluminum film 50 thereon. Suitably, semiconductive body 12 is ungrounded requiring control voltage 22 to be applied between control electrode 20 and semiconductive body by leads 26 and 70 bonded to aluminum contact 24 and film 50, respectively, while the output capacitance is sensed across output terminal 30 and film 50. Because insulator 64 is formed as a series of plateaus of gradually increasing height, a slowly increasing positive voltage applied between control electrode 20 and semiconductive body 12 tends to extend N-type conductivity region 16 outwardly in substantially instantaneous steps approximately equal to the length of each plateau when the applied control voltage exceeds each threshold level for forming an inversion layer beneath an insulator step. Thus a digitalized variation in capacitance (as shown by steps 74 in curve 76 of FIG. 4) is produced between output terminal 30 and film 50 as each threshold level corresponding to each thickness of silicon dioxide insulator 64 is exceeded notwithstanding a linear increase in control voltage 22. Desirably, the initial step of insulator 64 overlying N-type conductivity region 16 is at least approximately 500 A., with the elevation of the insulator increasing in substantially equal increments of between 200 and 500 A., for steps between 2 and 10 microns in length.

Figure 5:
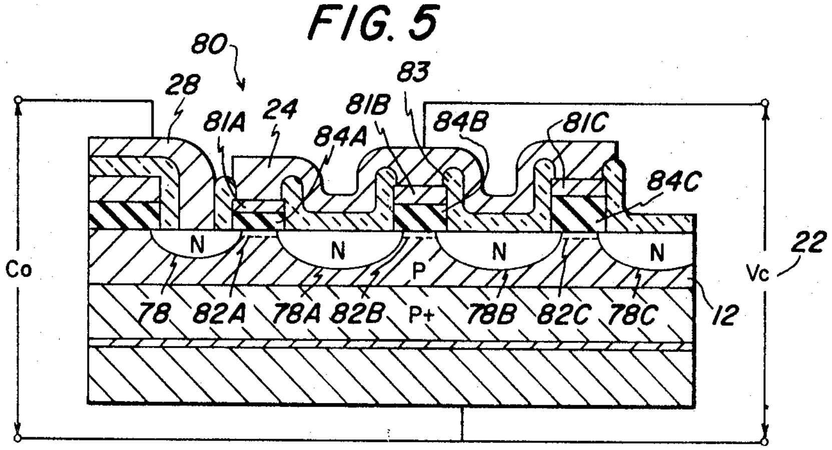
FIG. 5 is a sectional view of an alternate capacitor in accordance with this invention wherein output capacitance is increased by interconnecting adjacent PN junctions through sequentially formed inversion regions.

An alternate embodiment of this invention wherein the PN junction is extended by interconnecting regions of similar type conductivity with an inversion layer is illustrated in FIG. 5 wherein N-type conductivity region 78 of capacitor 80 is interconnected with adjacent N-type conductivity regions 78A, 78B and 78C by the sequential formation of inversion layers 82A, 82B and 82C, respectively, at the semiconductive body/insulator interface. To assure a smooth variation in output capacitance with positive going increases in control voltage 62, control electrode insulator 84A, 84B and 84C are photolytically etched to gradually increasing thicknesses with departure from region 78 assuring sequential formation of inversion regions 82A, 82B, and 82C between regions 78 and 78A, regions 78A and 78B and regions 78B and 78C, respectively. Because each control electrode insulator between adjacent N-type conductivity regions is of uniform thickness (i.e., the face of each insulator remote from planar semiconductive body 12 is substantially parallel to the plane of the semiconductive body as opposed to the tapered insulator configuration in capacitor 10 of FIG. 1), each inversion layer, e.g., inversion layer 82A, is produced substantially instantaneously and the capacitor exhibits a digitalized increase in output capacitance with the creation of each successive inversion layer.

Diode capacitor 80 is formed substantially identically to capacitor 62 and initially comprises the thermal growth of a silicon dioxide layer atop semiconductive body 12 to a thickness desired for the control electrode insulator, i.e., insulator 84C, disposed most remote from the initially extended N-type conductivity region. The silicon dioxide layer then is etched, e.g., utilizing a series of conventional photoresist etching steps, to produce a stepped silicon dioxide thickness of, for example, 500 A., 1,000 A., and 1,500 A., for insulators 84A, 84B, and 84C, whereupon a molybdenum film is deposited atop the entire surface of the structure. The deposited molybdenum film then is selectively masked with photoresist and etched with a suitable etchant, e.g., a solution of 76 percent orthophosphoric acid, 6 percent glacial acetic acid, 3 percent nitric acid and 15 percent water, to form control electrodes 81A, 81B and 81C and the silicon dioxide exposed by the molybdenum etch is removed from semiconductive body 12 utilizing a buffered HF etchant. After doped glass layer 83 is pyrolytically deposited atop the entire surface of the structure by heating the structure to 800° C. in a flowing argon stream saturated with ethylorthosilicate and triethyl phosphate, N-type conductivity regions 78, 78A, 78B and 78C are diffused into the semiconductive body 12 by baking the structure at a temperature of approximately 1,100° C. for 1178 hours. The doped glass then is etched, e.g., in buffered HF, to expose both a portion of control electrodes 81A–81C and the surface of N-type conductivity region 78 whereupon aluminum contact 24 is deposited atop each control electrode to permit simultaneous energization of the control electrodes by variable voltage source 22 while contact to exposed N-type conductivity region 78 is made by aluminum contact 28 to provide the output signal from the capacitor.

As voltage source 22 increases the positive potential of control electrodes 81A–81C relative to semiconductive body 12, the high capacitance between control electrode 81A and the semiconductive body (resulting from the relative thinness of silicon dioxide insulator 84A) produces inversion layer 82A interconnecting N-type conductivity regions 78 and 78A upon the applied control voltage exceeding the threshold level for forming an N-type conductivity inversion region below control electrode 81A. The extension of PN junction 14 from N-type conductivity region 78 to region 78A by inversion layer 82A rapidly increases the capacitance of the structure to a second level and the output capacitance remains substantially constant until the control voltage exceeds a threshold level producing inversion layer 82B below control electrode 81B. The PN junction then is extended to adjacent N-type conductivity region 78C with an associated increase in junction capacitance. When control voltage 22 subsequently is decreased, the output capacitance decreases in steplike fashion as inversion layers 82C, 82B and 80A are sequentially eradicated.

Figure 6:
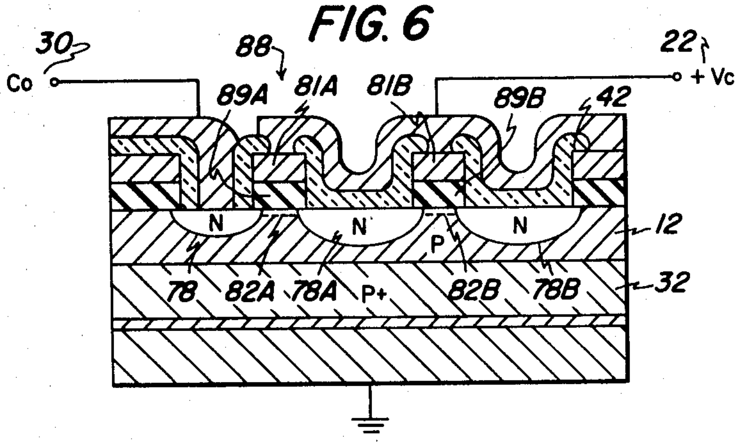
FIG. 6 is a sectional view of another smoothly varying capacitor in accordance with this invention.

The voltage-variable capacitor of this invention also can be fabricated with control electrode insulators of equal thickness when different dielectric materials are employed for the insulators as shown in capacitor 88 of FIG. 6. Capacitor 88 can be initially formed by epitaxially growing P-type conductivity semiconductive body 12 atop highly conductive region 32 whereupon an aluminum film (not shown) is deposited atop the surface of the semiconductive body to a thickness of approximately 2,000 A., by vacuum evaporation at a pressure typically below $5\times10^{15}$ Torr. After the deposited aluminum film is oxidized by conventional plasma anodization, the aluminum oxide is etched utilizing conventional photoresist techniques and a buffered HF etchant to form aluminum oxide insulator 89A. The structure then is heated in a flowing oxygen atmosphere, e.g., to a temperature above 1,000° C., to thermally grow silicon dioxide atop the exposed silicon surface and a molybdenum film is deposited atop the entire structure. After etching the molybdenum film to form control electrodes 81A and 81B, the control electrodes are utilized as a mask for etching both the silicon dioxide and aluminum oxide, e.g., utilizing a buffered HF solution, to precisely register control electrode insulators 89A and 89B, respectively, with the overlying molybdenum control electrodes. A donor impurity then is diffused into the surface of semiconductive body 12 from phosphorus doped glass layer 42 through the molybdenum mask to form regions 78 and 78A and 78B in registration with the control electrodes. Typically each N-type conductivity region is approximately 3–20 microns wide with an interval of about 5 microns being provided between regions.

When the control electrodes of the variable capacitor are electrically interconnected and energized with control voltage source 22, the high dielectric constant of aluminum oxide insulator 89A relative to the silicon dioxide insulator 89B produces an initial inversion layer 82A between regions 78 and 78A at a first threshold level to increase the capacitance between region 78 and semiconductive body 12 with continued increases in control voltage source 22 subsequently producing inversion layer 82B under silicon dioxide insulator 89B to further raise the capacitance sensed on output terminal 30. In general when the decreased capacitance of the control electrode insulator is produced by the utilization of materials having different dielectric constants, the dielectric constants of adjacent control electrode insulators preferably should decrease by at least a factor of 1.5 with the lower dielectric constant materials being spaced more remotely from the initially enlarged PN junction.

Figure 7:
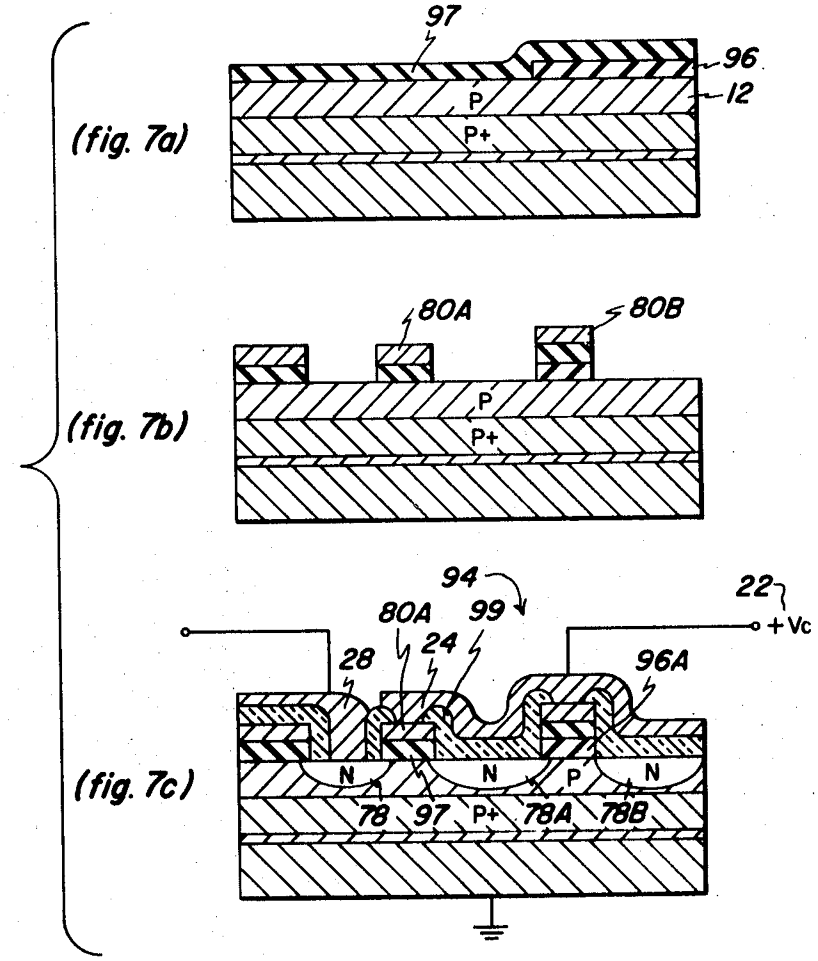
FIG. 7 is a flow chart illustrating in sectional view the fabrication of an alternate smoothly varying capacitor of this invention.

The smoothly varying capacitor of this invention also can utilize laminar layers of diverse dielectric materials for the control electrode insulators as illustrated by capacitor 94 of FIG. 7. To fabricate such capacitor, a first layer 96 of relatively low dielectric material such as silicon dioxide is deposited, e.g., by conventional RF sputtering or oxidation and etching, leaving silicon dioxide atop a portion of semiconductive body 12 and a second layer 97 of a relatively higher dielectric material, e.g., aluminum oxide, is deposited by conventional RF sputtering techniques over the entire surface of the structure as illustrated in FIG. 7A. A molybdenum film then is sputter deposited atop the silicon dioxide layer and the molybdenum is subsequently etched to form control electrodes 80A and 80B (illustrated in FIG. 7B) permitting the aperturing of the exposed silicon dioxide and aluminum oxide utilizing the control electrodes as a mask and buffered HF as an etchant. A doped glass layer 99 depicted in FIG. 7C then is deposited atop the structure and the structure is baked at a temperature in excess of 1,000° C. to form N-type conductivity regions 78, 78A and 78B having edges in underlying registration with the control electrodes whereupon the doped glass is etched to permit deposition of aluminum contacts 24 and 28 atop the control electrodes and N-type conductivity region 78, respectively.

As control voltage source 22 applied simultaneously to the gate electrodes is increased, region 78 is sequentially interconnected with adjacent regions 78A and 78B by inversion layers formed between the control electrode insulators and semiconductive body 12 with the higher dielectric constant of aluminum oxide insulator 96 underlying gate electrode 80A assuring an interconnecting of regions 78 and 78A prior to the formation of an inversion layer between silicon dioxide insulator 96A and semiconductive body 12. In general, any combination of semiconductor insulators, e.g., silicon dioxide, silicon nitride, silicon oxynitride, aluminum oxide, can be employed to form the laminar insulator. The difference between the dielectric constants of the chosen layers forming a laminar insulator, however, should vary by a factor in excess of two to assure the capacitance between the overlying gate electrode and the underlying semiconductive body is determined almost entirely by the lower dielectric constant material between the control electrode and the semiconductive wafer.

What I claim as new and desire to secure by Letters Patent of the United States is:

1. A voltage-variable capacitor comprising:

A. a semiconductive body of first type conductivity;

B. at least one region of second type conductivity extending from a first portion of one surface of said semiconductor body to a predetermined depth, C. an insulating layer with an electrically continuous conductive film disposed thereon overlying a second portion of said one surface and extending to just beyond a surface terminating edge of said second type conductivity region, said insulating layer being characterized by a capacitance between the conductive film and the second portion of the surface of the semiconductor body diminishing in value with increased departure of said insulating layer from the edge of said second type, conductivity region;

D. means for applying a control signal between said conductive film and said semiconductive body to gradually extend said second type conductivity region outwardly by causing an inversion layer to form in said semiconductive body of first type conductivity along the interface between said insulating layer and said semiconductive body, the span of said extension being incrementally controlled by the magnitude of said applied control signal, and E. means connected between said second type conductivity region and said semiconductive body to exhibit a capacitance which varies with the extension of said second type, conductivity region below said insulating layer.

2. A voltage-variable capacitor according to claim 1 wherein said diminishing capacitance of said insulating layer is produced by an increase in the thickness of said insulating layer with increased departure of said insulating layer from the edge of said second type conductivity region.

3. A voltage-variable capacitor according to claim 2 wherein said insulating layer is a silicon dioxide layer having a linearly increasing thickness with departure from the edge of said second type conductivity region, said silicon dioxide layer being further characterized by a thickness of at least 500 A., at the edge of said second type conductivity region.

4. A voltage-variable capacitor according to claim 3 wherein said silicon dioxide layer is characterized by a linear slope between 0.25 and 3.0 percent.

5. A voltage-variable capacitor according to claim 2 wherein said diminishing capacitance of said insulating layer is produced by increasing the thickness of said insulating layer in steps to produce a digitalized change in the output capacitance of said capacitor with each extension of said second type conductivity region below successively thicker steps of said insulating layer.

6. A voltage-variable capacitor according to claim 5 wherein said insulating layer increases in thickness in incremental steps having a height between 200 A., and 500 A.

7. A voltage-variable capacitor according to claim 2 wherein said semiconductive body is silicon, said insulating layer is silicon dioxide and said conductive film is a metal selected from the group consisting of molybdenum, tungsten and platinum.

8. A voltage-variable capacitor according to claim 7 further including a molybdenum heat sink bonded to said semiconductive body.

9. A voltage-variable capacitor comprising:

A. a semiconductive body of first type conductivity;

B. a plurality of spaced-apart regions of second type conductivity extending through a major face of said semiconductive body;

C. output means connected between one said region of second type conductivity and said semiconductive body;

D. a plurality of control electrodes extending between and overlying the edges of adjacent regions of second type conductivity, each of said control electrodes being insulated from the major face of said semiconductive body by discrete insulating layers characterized by a decreasing capacitance between said control electrodes and said underlying semiconductive body with increased departure of each said insulating layer from the second type conductivity region connected to said output means;

E. contact means electrically interconnecting said control electrodes;

F. means for applying a control signal between said contact means and said semiconductive body to sequentially interconnect adjacent ones of said second type conductivity regions by inversion regions extending outwardly from the second type conductivity region connected to said output means, said sequential interconnection of said second type conductivity regions producing a variation in the output capacitance across said output means with increased amplitude of the control signal applied to said contact means.

10. A voltage-variable capacitor according to claim 9 wherein said insulating layers are silicon dioxide, the thickness of each said silicon dioxide layer increasing with increased departure of the insulating layers from said region of second type conductivity connected to said output means.

11. A voltage-variable capacitor according to claim 9 wherein said insulating layers are of comparable thickness and of diverse composition, said insulating layers having a dielectric constant varying inversely with the span of each said insulating layer from the second conductivity region connected to said output means.

12. A voltage-variable capacitor according to claim 9 wherein said insulating layer overlying an edge of said second conductivity region connected to said output means is a first material having a first dielectric constant and said immediately adjacent insulating layer is a laminar film consisting of a layer of said first material and an underlying layer of a second material having a dielectric constant lower than the dielectric constant of said first material.

13. A voltage-variable capacitor structure according to claim 12 wherein said first material is aluminum oxide and said second material is silicon dioxide.

14. A voltage-variable capacitor structure according to claim 9 wherein said semiconductive body is silicon, said insulating layers are silicon dioxide in thicknesses gradually increasing with increased departure of each said insulating layer from the second type conductivity region connected to said output means and said control electrodes are a metal selected from the group consisting of molybdenum, tungsten, and platinum.